(12) United States Patent
Park

(10) Patent No.: US 6,955,935 B2
(45) Date of Patent: Oct. 18, 2005

(54) METHOD FOR CHEMICAL MECHANICAL POLISHING FOR FABRICATING SEMICONDUCTOR DEVICE

(75) Inventor: Jong Hyuk Park, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/876,395

(22) Filed: Jun. 25, 2004

(65) Prior Publication Data

US 2005/0130430 A1 Jun. 16, 2005

(30) Foreign Application Priority Data

Dec. 15, 2003 (KR) .................... 10-2003-0091408

(51) Int. Cl.[7] .......................................... H01L 21/00
(52) U.S. Cl. .................... 438/41; 438/54; 438/692; 438/693
(58) Field of Search ................ 438/60, 54, 692, 438/693, 314, 723, 743; 257/419, 435, 515, 257/619, 649

(56) References Cited

U.S. PATENT DOCUMENTS 6,634,930 B1 * 10/2003 Chen et al. .................... 451/41
6,733,685 B2 * 5/2004 Beilin et al. ................... 216/38

* cited by examiner

*Primary Examiner*—Carl Whitehead, Jr.
*Assistant Examiner*—Yennhu B. Huynh
(74) *Attorney, Agent, or Firm*—Ladas & Parry LLP

(57) ABSTRACT

Disclosure is a method for a chemical mechanical polishing process for fabricating a semiconductor device. The method for performing the chemical mechanical polishing process for a copper layer on a semiconductor wafer comprises the steps of: performing the chemical mechanical polishing process for the copper layer on the semiconductor wafer by using slurry; performing a standstill process in a middle of the chemical mechanical polishing process; and carrying out the chemical mechanical polishing process again after performing the standstill process.

7 Claims, 2 Drawing Sheets

METHOD FOR CHEMICAL MECHANICAL POLISHING FOR FABRICATING SEMICONDUCTOR DEVICE

BACKGROUND OF THE INVENTION

1. Field of the Invention

The present invention relates to a method for chemical mechanical polishing for fabricating a semiconductor device, and more particularly to a method for chemical mechanical polishing for fabricating a semiconductor device, which can solve a problem in that copper is not removed in a copper removing process when performing a chemical mechanical process for copper.

2. Description of the Prior Art

In a conventional CMP process for copper, copper and barrier metal removing processes are separately performed.

However, according to a conventional technique, if copper is not completely removed through the copper removing process, copper wirings are circuit-shorted because copper is not removed from barrier metal or copper prevents barrier metal from being normally removed through the barrier metal removing process.

Also, if layers of metal wirings increase, copper is not completely removed from wiring of a higher layer In addition, it is difficult to completely remove copper even though a CMP polishing time increases in the copper removing process.

SUMMARY OF THE INVENTION

Accordingly, the present invention has been made to solve the above-mentioned problems occurring in the prior art, and an object of the present invention is to provide a method for CMP for fabricating a semiconductor device capable of improving an efficiency of removing copper by performing tuning for a detailed process recipe in a copper removing process when performing CMP for copper.

In order to accomplish this object, according to an aspect of the present invention, there is provided a method for performing a chemical mechanical polishing (CMP) process for a copper layer on a semiconductor wafer when fabricating a semiconductor device, the method comprising the steps of: performing the chemical mechanical polishing process for the copper layer on the semiconductor wafer by using slurry; performing a standstill process in a middle of the chemical mechanical polishing process; and carrying out the chemical mechanical polishing process again after performing the standstill process.

Also, the standstill process employs any one selected from the group consisting of a first method in which an amount of slurry is reduced, supply of slurry is entirely cut off, the semiconductor wafer is temporarily separated from a chemical mechanical polishing pad, another kinds of chemical or water is supplied, or the chemical mechanical polishing process is performed at a low polishing rate, and a second method in which slurry is provided without separating the semiconductor wafer from the polishing pad or the wafer is prevented from being rotated.

In addition, if the low polishing rate is achieved during the standstill process, the low polishing rate is achieved by lowering revolution per minute (rpm) or pressure in the middle of the chemical mechanical polishing process.

Furthermore, the chemical mechanical polishing process is used for a copper layer having a thickness of above 1 $\mu$m.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
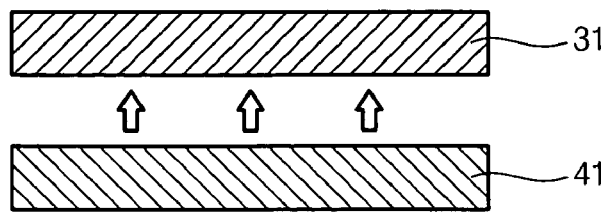
FIGS. 1A to 1E are sectional views for explaining a method for CMP for fabricating a semiconductor device according to the present invention.

Hereinafter, a method for polishing a copper layer and a method for forming a copper layer wiring using the same according to the present invention will be described with reference to the accompanying drawings. In the following description and drawings, the same reference numerals are used to designate the same or similar components, and so repetition of the description on the same or similar components will be omitted.

Hereinafter, a method for chemical mechanical polishing (CMP) for fabricating a semiconductor device according to the present invention will be described in more detail with the accompanying drawings.

FIGS. 1A to 1E are sectional views for explaining the method for CMP for fabricating a semiconductor device according to the present invention.

As shown in FIG. 1A, in the method for CMP for fabricating a semiconductor device according to the present invention, a semiconductor wafer 31 having a copper layer (not shown) formed thereon and a chemical mechanical polishing pad (CMP pad) 41 are firstly prepared in order to carry out a CMP process.

Figure 1B:
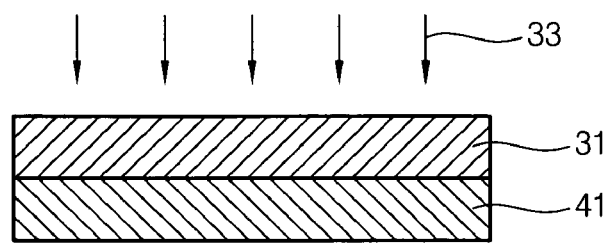

Then, as shown in FIG. 1B, the CMP pad 41 makes contact with the semiconductor wafer 31, thereby carrying out the CMP process 33.

Figure 1C:
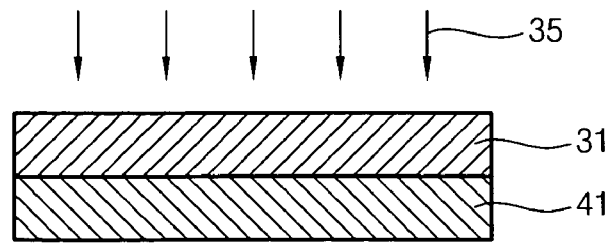

Subsequently, as shown in FIG. 1C, a rest process 35 is performed in the middle of the CMP process.

At this time, the standstill process 35 employs a method in which an amount of slurry is reduced, supply of slurry is entirely cut off, the semiconductor wafer 31 is temporarily separated from the CMP pad 41, another kinds of chemical or water is supplied, or the CMP process is performed at a low polishing rate.

Also, during the rest process 35, slurry is provided without separating the semiconductor wafer from the CMP pad or the wafer is prevented from being rotated.

Herein, if the rest process is carried out with a low polishing rate, the low polishing rate is achieved by lowering revolution per minute (rpm) or pressure in the middle of the CMP process, and the polishing rate may increase when the CMP process is again carried out.

Figure 1D:
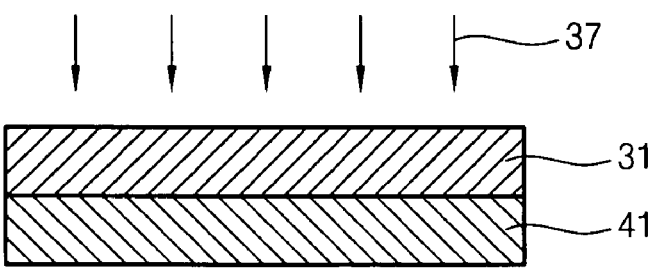

After that, as shown in FIG. 1D, after carrying out the standstill process 35, the CMP process 37 is performed in order to remove the copper layer (not shown) from the semiconductor wafer.

Figure 1E:
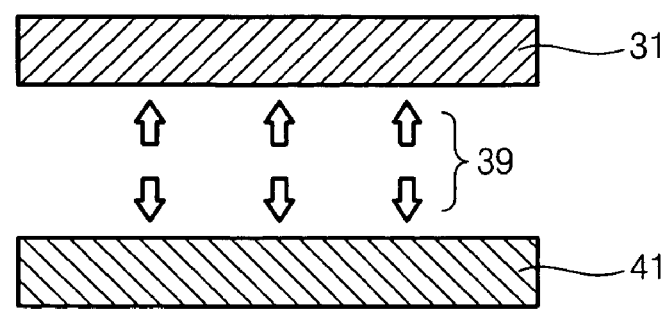

Subsequently, as shown in FIG. 1E, after performing the CMP process 37, the standstill process 39 is carried out again. Then, a series of CMP processes are repeatedly performed through a plurality of standstill processes.

Meanwhile, the present invention employing the standstill process performed in the middle of the CMP process, can be used for polishing a very thick Cu layer, for example, a copper layer having a thickness of above 1 $\mu$m.

According to a conventional process for removing copper, it is difficult to completely remove copper even if a polishing time of a CMP process is increased. However, according to the present invention, copper can be completely removed by performing a rest process in the middle of the CMP process, even though it may be varied depending on slurry.

The standstill process allows a chemical characteristic of slurry to change, so that copper is removed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of performing a chemical mechanical polishing (CMP) process for removing a copper layer on a semiconductor wafer when fabricating a semiconductor device, the method comprising the steps of:
   i) performing the chemical mechanical polishing process by developing pressure between a CMP pad contacting the copper layer coated with slurry being supplied while either the CMP pad or the copper layer or both are in motion with respect to each other;
   ii) pausing the movement between the CMP pad and the copper layer for a predetermined duration during the chemical mechanical polishing process of step i), wherein no cleaning process for removing the slurry supplied in the step i) is performed during the predetermined duration; and
   iii) resuming the chemical mechanical polishing process of step i) after the predetermined duration of step ii), wherein the copper layer is removed by sequentially performing the steps i), ii), and iii) one or more times.

2. The method as claimed in claim 1, wherein the supply of slurry is reduced to a lower rate or cut off during the predetermined duration such that sequential performance of steps i), ii), and iii) is capable of removing the copper layer having a thickness of above 1 µm.

3. The method as claimed in claim 1, wherein the CMP pad and the copper layer are separated relieving pressure such that sequential performance of steps i), ii), and iii) is capable of removing the copper layer having a thickness of above 1 µm.

4. The method as claimed in claim 1, wherein a non-slurry chemical material or water is supplied during the predetermined duration such that sequential performance of steps i), ii), and iii) is capable of removing the copper layer having a thickness of above 1 µm.

5. The method as claimed in claim 1, wherein the supply of slurry is continued or increased during the predetermined duration such that sequential performance of steps i), ii), and iii) is capable of removing the copper layer having a thickness of above 1 µm.

6. A method of performing a chemical mechanical polishing (CMP) process for removing a copper layer on a semiconductor wafer when fabricating a semiconductor device, the method comprising the steps of:
   i) performing the CMP process by applying a CMP pad on the copper layer coated with a slurry at a first pressure while either the CMP pad or the copper layer or both are in motion with respect to each other at a first polishing rate;
   ii) lowering the first polishing rate or the first pressure or both for a predetermined duration during the CMP process of step i), wherein no cleaning process for removing the slurry supplied in the step i) is performed during the predetermined duration; and
   iii) resuming the CMP process of step i) after the predetermined duration of step ii), wherein the copper layer is removed as a result of performing steps i), ii), and iii) sequentially one or more times.

7. The method as claimed in claim 6, wherein sequential performance of steps i), ii), and iii) is capable of removing the copper layer having a thickness of above 1 µm.

* * * * *